(12) United States Patent
Ishii

(10) Patent No.: US 11,458,716 B2
(45) Date of Patent: Oct. 4, 2022

(54) LAMINATION APPARATUS AND METHOD OF MANUFACTURING DISPLAY DEVICE USING THE SAME

(71) Applicant: Samsung Display Co., Ltd., Yongin-si (KR)

(72) Inventor: Hirokazu Ishii, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 22 days.

(21) Appl. No.: 16/733,114

(22) Filed: Jan. 2, 2020

(65) Prior Publication Data

US 2020/0298544 A1 Sep. 24, 2020

(30) Foreign Application Priority Data

Mar. 22, 2019 (KR) .................. 10-2019-0032902

(51) Int. Cl.
| | | |
|---|---|---|
| *B32B 37/00* | (2006.01) | |
| *B32B 38/18* | (2006.01) | |
| *G02F 1/13* | (2006.01) | |
| *B29C 63/20* | (2006.01) | |
| *B29C 63/04* | (2006.01) | |
| *B29C 70/28* | (2006.01) | |
| *H01L 51/56* | (2006.01) | |
| *B32B 37/10* | (2006.01) | |
| *H01L 51/00* | (2006.01) | |
| *H01L 27/32* | (2006.01) | |

(52) U.S. Cl.
CPC ...... *B32B 37/0046* (2013.01); *B32B 38/1866* (2013.01); *G02F 1/1303* (2013.01); *B29C 63/04* (2013.01); *B29C 63/20* (2013.01); *B29C 70/28* (2013.01); *B32B 37/10* (2013.01); *B32B 37/1009* (2013.01); *B32B 38/18* (2013.01); *B32B 2457/202* (2013.01); *B32B 2457/206* (2013.01); *H01L 27/3244* (2013.01); *H01L 51/0097* (2013.01); *H01L 51/56* (2013.01); *Y10T 156/10* (2015.01); *Y10T 156/1028* (2015.01); *Y10T 156/17* (2015.01)

(58) Field of Classification Search
None
See application file for complete search history.

(56) References Cited

U.S. PATENT DOCUMENTS

| | | | |
|---|---|---|---|
| 9,498,938 B2 | 11/2016 | Son et al. | |
| 10,675,849 B2* | 6/2020 | Kim | ............. B32B 38/18 |
| 2014/0138009 A1* | 5/2014 | Lim | ............. H01L 51/56 |
| | | | 156/60 |

FOREIGN PATENT DOCUMENTS

| | | |
|---|---|---|
| JP | 2009-294551 | 12/2009 |
| JP | 2010-049048 | 3/2010 |
| JP | 2011-022403 | 2/2011 |

(Continued)

*Primary Examiner* — Linda L Gray
(74) *Attorney, Agent, or Firm* — H.C. Park & Associates, PLC

(57) ABSTRACT

A lamination apparatus including a first stage including a first body portion and an accommodation portion disposed on a bottom surface of the first body portion, a second stage disposed to face the first stage, and a jig device disposed between the first stage and the second stage, the jig device including a second body portion and at least one jig portion, in which the at least one jig portion has one end fastened to the second body portion and the other end having a rounded shape.

6 Claims, 18 Drawing Sheets

(56) References Cited

FOREIGN PATENT DOCUMENTS

| | | |
|---|---|---|
| JP | 2015-039862 | 3/2015 |
| KR | 10-1701247 | 2/2017 |

* cited by examiner

LAMINATION APPARATUS AND METHOD OF MANUFACTURING DISPLAY DEVICE USING THE SAME

CROSS-REFERENCE TO RELATED APPLICATION

This application claims priority from and the benefit of Korean Patent Application No. 10-2019-0032902, filed on Mar. 22, 2019, which is hereby incorporated by reference for all purposes as if fully set forth herein.

BACKGROUND

Field

Exemplary embodiments of the invention relate generally to a lamination apparatus and a method of manufacturing a display device using the same.

Discussion of the Background

The display device market has been developed for a flat panel display (FPD). In flat panel displays, an area thereof may be easily increased while thickness and weight may be decreased.

Flat panel displays may include a liquid crystal display (LCD), a plasma display panel (PDP), an organic light emitting display (OLED), and the like.

However, recently, curved panel displays (CPDs) that have a curvature in a partial area thereof have been developed in FPDs, and an additional member or sensor may be disposed on a curved surface of a display. In CPDs, a larger amount of space may be utilized than that of FPDs, and a variety of functions may be provided through sensors disposed on a curved surface.

Accordingly, CPDs have been developed as a next-generation display device, and thus, a variety of evaluation apparatuses or manufacturing apparatuses related to a curved substrate or a curved panel are required.

More particularly, when joining a cover window having a curved shape to a panel having a flat shape in a CPD, since the cover window and the panel have different shapes, it is not easy to join a curved surface part with a conventional joining method.

The above information disclosed in this Background section is only for understanding of the background of the inventive concepts, and, therefore, it may contain information that does not constitute prior art.

SUMMARY

A lamination apparatus constructed according to exemplary embodiments of the invention includes a pivotable jig device and is capable of joining a curved-shaped member to a flat-shaped member.

Exemplary embodiments also provide a method of manufacturing a display device, which easily joins a first member and a second member having different shapes by using the lamination apparatus without a gap therebetween.

Additional features of the inventive concepts will be set forth in the description which follows, and in part will be apparent from the description, or may be learned by practice of the inventive concepts.

A lamination apparatus according to an exemplary embodiment includes a first stage including a first body portion and an accommodation portion disposed on a bottom surface of the first body portion, a second stage disposed to face the first stage, and a jig device disposed between the first stage and the second stage, the jig device including a second body portion and at least one jig portion, in which the at least one jig portion has one end fastened to the second body portion and the other end having a rounded shape.

The accommodation portion may be recessed upwardly from a portion of the bottom surface of the first body portion, and an outer part of the accommodation portion may have a curved surface.

The first stage may further include a first sealing portion surrounding the outer part of the accommodation portion.

The first stage may further include a fixing device disposed on a top surface of the first body portion overlapping with the accommodation portion.

The jig portion may include a first jig portion including a first end fastened to the second body portion and a second end opposite to the first end, and a second jig portion including a third end facing the first end of the first jig portion and a fourth end opposite to the third end.

A width from the second end of the first jig portion to the fourth end of the second jig portion along a first direction may be less than a width of the accommodation portion measured in the first direction.

The first jig portion and the second jig portion may be configured to pivot by a predetermined radius on a central axis located in the second body portion, to which the first end of the first jig portion and the third end of the second jig portion are fastened.

The jig device may further include a pressure device configured to apply a first pressure between the first jig portion, the second jig portion, and the first stage.

The second stage may include a first sub-stage disposed below the first jig portion, and a second sub-stage spaced apart from the first sub-stage and disposed below the second jig portion.

The first sub-stage may include a fixing area, in which at least a portion thereof is curved, and the fixing area may face the second end of the first jig portion.

The second stage may further include a second sealing portion disposed on the fixing area of the first sub-stage.

A method of manufacturing a display device according to another exemplary embodiment includes preparing a first member on a first stage, the first member having at least one curved portion, preparing a second member on a jig device and moving the jig device, such that the second member faces the first member, and fixing the first stage and the jig device and joining the first member and the second member.

The jig device may include a body portion and at least one jig portion having one end fastened to the body portion and the other end having a rounded shape, and the jig portion may pivot by a predetermined radius on a central axis disposed in the body portion.

Preparing the second member on the jig device may include forming an adhesive sheet on the jig device, and placing the second member on the adhesive sheet.

Preparing the second member on the jig device and moving the jig device may further include bending the second member by pivoting the jig portion, such that a central part of the second member is placed below both ends thereof, and unbending the second member to be disposed adjacent to the first member while being spaced apart therefrom.

Fixing the first stage and the jig device and joining the first member and the second member may include applying a first pressure between the first stage and the jig device, and applying a second pressure higher than the first pressure between the jig device and the adhesive sheet.

The first pressure may be within a range of 10 Pa to 10 kPa, and the second pressure may be within a range of 0.1 MPa to 0.9 MPa.

The first stage may further include a fixing device forming a vacuum at least in a partial area of a bottom surface, and the first member may be provided on the bottom surface of the first stage and the fixing device may form a vacuum between the first member and the bottom surface.

The first member may include one surface parallel to the bottom surface of the first stage and a first peripheral part bent downward from the one surface, and a width of the one surface of the first member along a second direction may be less than a width of the first member measured in the second direction.

The first member may further include a second peripheral part bent downward from the one surface, and a width between opposing ends of the first and second peripheral parts of the first member may be less than the width of the first member measured in the second direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
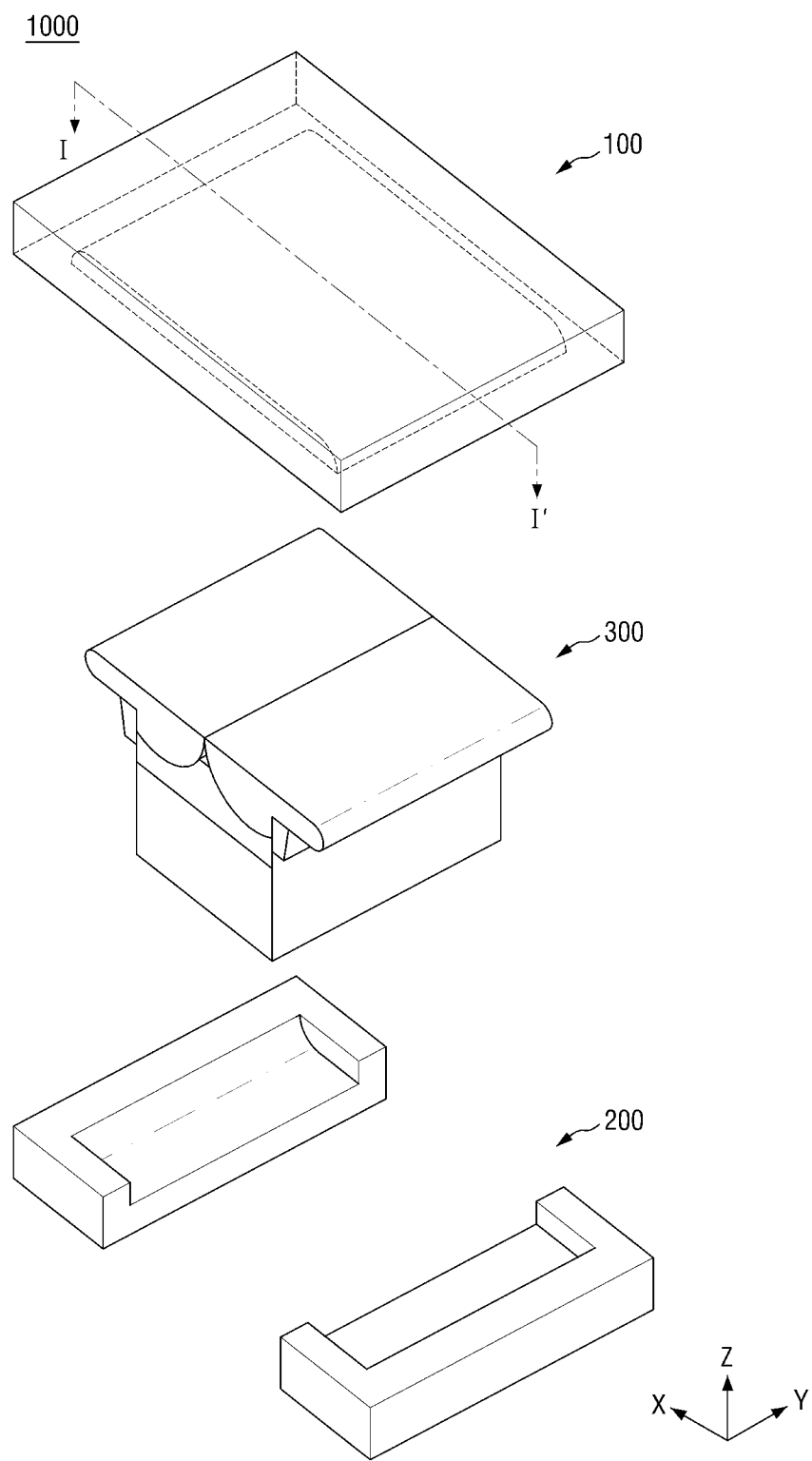
FIG. 1 is a perspective view of a lamination apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
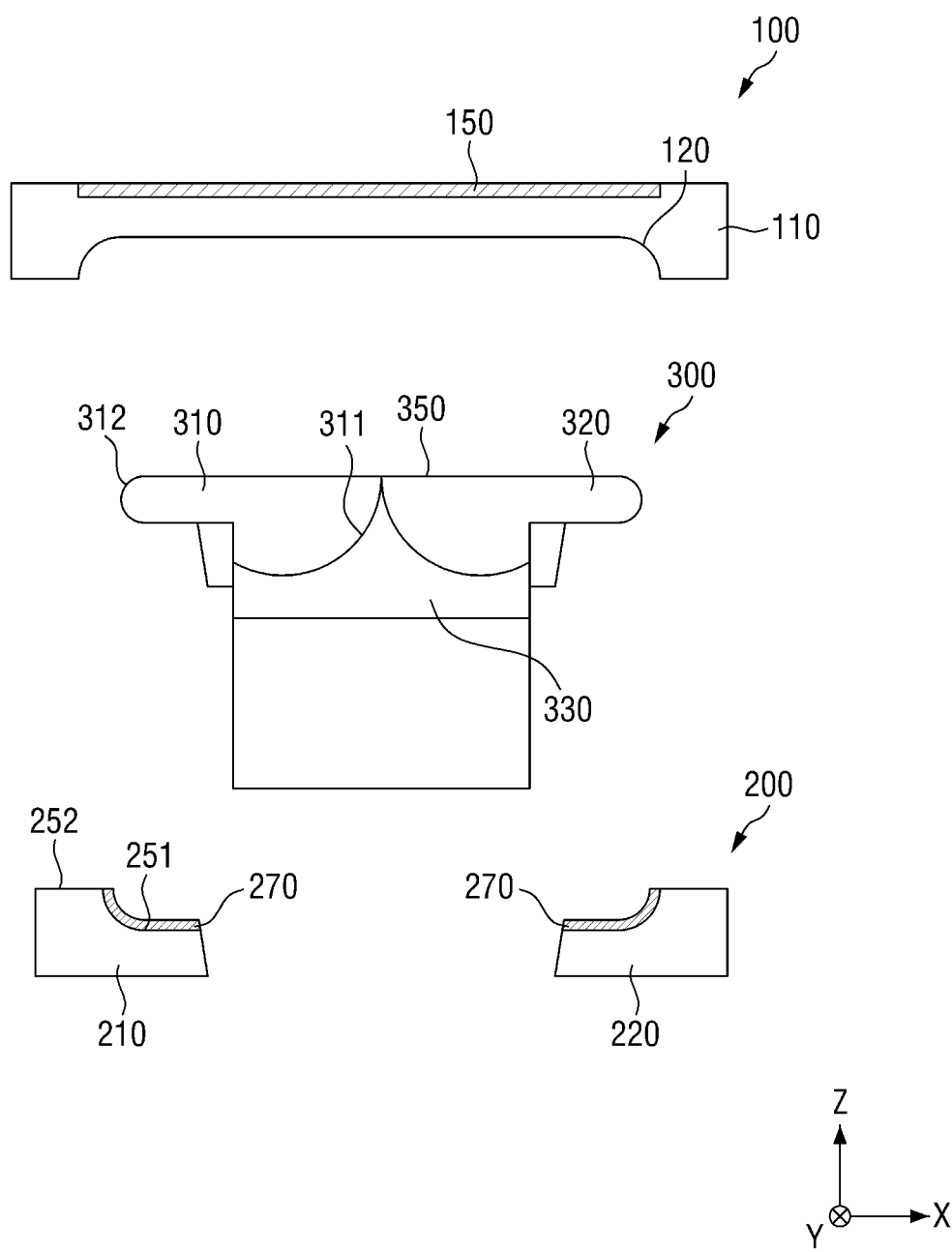
FIG. 2 is a cross-sectional view of the lamination apparatus taken along line I-I' of FIG. 1.

FIG. 1 is a perspective view of a lamination apparatus according to an exemplary embodiment. FIG. 2 is a cross-sectional view of the lamination apparatus taken along line I-I' of FIG. 1.

A lamination apparatus 1000 according to an exemplary embodiment may include a first stage 100, a second stage 200, and a jig device 300. The lamination apparatus 1000 may join a first member to a second member, which are prepared on the first stage 100 and the jig device 300, respectively. In particular, since the first stage 100 provided with the first member and the jig device 300 provided with the second member have outer surfaces having curvatures, the lamination apparatus 1000 may easily join a flat member 20 (refer to FIG. 10) to a curved part of a curved member 10 (refer to FIG. 8).

In the lamination apparatus 1000 according to the illustrated exemplary embodiment, the first stage 100 and the jig device 300 have curved shapes that conform to the shape of the curved member 10, which is an object to be joined, such that product defects that may occur from joining the curved member 10 and the flat member 20 may be prevented. In general, when the curved member 10 and the flat member 20 having different shapes are to be joined, the flat member 20 and the curved member 10 may be inaccurately joined, such as not mutually being aligned or forming a gap therebetween. A joining method using the lamination apparatus 1000 according to an exemplary embodiment includes an operation of preforming the flat member 20 to have a predetermined shape, such that the flat member 20 may be prevented from being damaged when the flat member 20 and the curved member 10 come into contact with each other. Hereinafter, the lamination apparatus 1000 will be described in more detail.

Referring to FIGS. 1 and 2, the lamination apparatus 1000 may include the first stage 100, the second stage 200 facing the first stage 100, and the jig device 300 disposed therebetween.

The first stage 100 may be provided with the first member, which is an object to be joined during the joining process using the lamination apparatus 1000. The first stage 100 may be an upper stage located above the jig device 300 in the lamination apparatus 1000. The first stage 100 may include a first body portion 110 to provide a space in which the first member may be prepared. A shape of the first body portion 110 is not particularly limited. In the drawings, it is shown that sides of the first body portion 110 extend in a first direction (X-axis direction) and a second direction (Y-axis direction), and corners thereof have angular shapes. However, the inventive concepts are not limited thereto, and in some exemplary embodiments, the first body portion 110 may have rounded or circular corners.

According to an exemplary embodiment, the first stage 100 may include an accommodation portion 120 to which the curved member 10 is provided. The accommodation portion 120 may be formed on one surface of the first stage 100, in particular, a bottom surface of the first body portion 110. The accommodation portion 120 may be formed as a recess from a portion of the bottom surface of the first body portion 110 in an upper direction. The first member provided to the first stage 100 may be fixed to the accommodation portion 120, and may be joined to the second member provided to the jig device 300.

As described above, the first member may be the curved member 10 (see FIG. 8) and may have a partial area having a curved shape. In an exemplary embodiment, the accommodation portion 120 may have a shape, in which an outer part of the recessed area upward from the bottom surface of the first body portion 110 is rounded with a certain curvature. The curved member 10 to be joined using the lamination apparatus 1000 may have a partial area having a flat surface, and an outer part formed to be curved from the flat surface in one direction, for example, in a downward direction. The accommodation portion 120 of the first stage 100 may have a partial area, which has a certain curvature and a rounded shape, such that the curved member 10 having the curved outer part may be fixed. The curvature of the rounded area of the accommodation portion 120 is not particularly limited. The area of the accommodation portion 120 may be designed according to a shape of the outer part of the curved member 10 to be joined, such that the curved member 10 may be fixed to the accommodation portion 120 without a gap therebetween.

According to an exemplary embodiment, the first stage 100 may include a fixing device 150 for fixing the curved member 10 provided to the accommodation portion 120. The first stage 100 may fasten the provided curved member 10 to the accommodation portion 120, or may fix the curved member 10 to the accommodation portion 120 using the fixing device 150. A shape of the accommodation portion 120 may coincide with that of the curved member 10. When the accommodation portion 120 and the curved member 10 are physically attached and fixed to each other, an outer surface of the curved member 10 may be damaged during an operation of providing the curved member 10 to the first stage 100. As such, the first stage 100 may include the additional fixing device 150, and may fix the curved member 10 provided to the accommodation portion 120 without a gap.

A type of the fixing device 150 is not particularly limited. For example, the fixing device 150 may be a mechanical fixing portion, which is disposed on one side adjacent to the accommodation portion 120 and fixes the curved member 10, or may be an electrostatic generator using static electricity between the accommodation portion 120 and the curved member 10. In an exemplary embodiment, the fixing device 150 may be a vacuum-forming device, which forms vacuum pressure between the accommodation portion 120 and the curved member 10 provided thereto.

Figure 3:
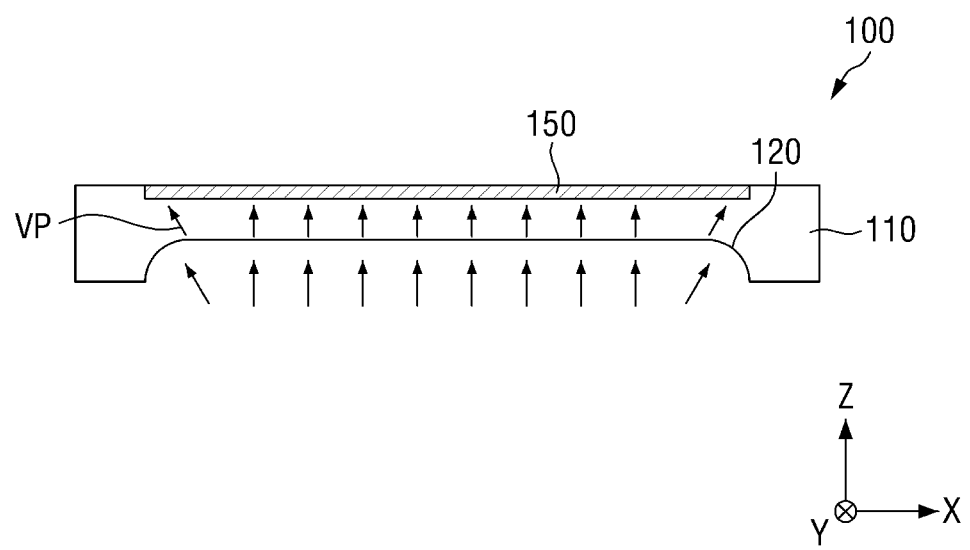
FIG. 3 is a schematic diagram illustrating an operation of a fixing device of a first stage according to an exemplary embodiment.

FIG. 3 is a schematic diagram illustrating an operation of a fixing device of a first stage according to an exemplary embodiment.

Referring to FIG. 3, the fixing device 150 according to an exemplary embodiment may be disposed on one surface of the first stage 100, for example, a top surface of the first body portion 110. The first stage 100 is formed to have a predetermined thickness, such that the accommodation portion 120 and the fixing device 150 may be spaced apart from each other. The fixing device 150 may provide vacuum pressure VP to the accommodation portion 120 through a space spaced apart from the accommodation portion 120. In the joining process using the lamination apparatus 1000, when the curved member 10 is provided to the accommodation portion 120, the fixing device 150 may provide the vacuum pressure VP to the accommodation portion 120, and the vacuum pressure VP may be transferred between the accommodation portion 120 and the curved member 10. The vacuum pressure VP transferred therebetween may fix the curved member 10 without a gap from the accommodation portion 120. Accordingly, the curved member 10 provided to the first stage 100 may be fixed to the accommodation portion 120 and joined to the second member provided to the jig device 300 which will be described below, for example, the flat member 20, at a precise position. However, as described above, the type of the fixing device 150 is not particularly thereto.

The first stage 100 may further include a first sealing portion 170 (see FIG. 4), which seals a space between the first stage 100 and the jig device 300 during the joining process. According to an exemplary embodiment, the first stage 100 may include the first sealing portion 170 disposed to surround a peripheral part of the accommodation portion 120.

Figure 4:
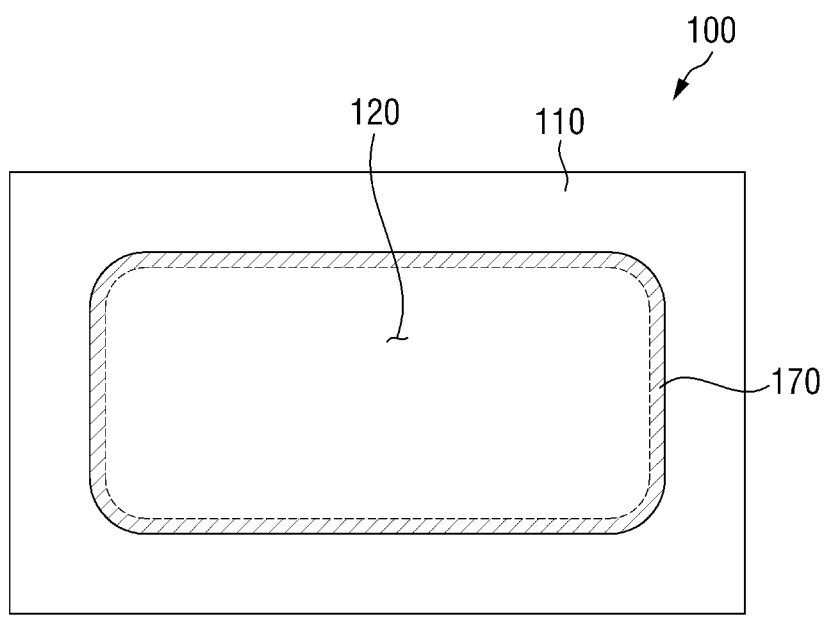
FIG. 4 is a plan view of the first stage according to an exemplary embodiment.

FIG. 4 is a plan view of the first stage according to an exemplary embodiment.

FIG. 4 shows a bottom surface of the first stage 100 when viewed from below according to an exemplary embodiment. Referring to FIG. 4, the first stage 100 according to an exemplary embodiment may include the first sealing portion 170. In the joining process using the lamination apparatus 1000, the first sealing portion 170 may seal a space among the first stage 100, the jig device 300, and the second stage 200, which are joined to one another. As will be described below, the lamination apparatus 1000 may compress and join the curved member 10 and the flat member 20 at high pressure. In this case, the first sealing portion 170 may be disposed, such that high pressure provided after the curved member 10 comes into contact with the flat member 20, does not leak into the space between the first stage 100 and the jig device 300 or the second stage 200.

The first sealing portion 170 is disposed to surround the peripheral part of the first accommodation portion 120 so as to come into partial contact with the flat member 20 or an adhesive sheet 30 (refer to FIG. 8), which will be described below, when the curved member 10 comes into contact with the flat member 20. The first sealing portion 170 may function as a partition, which seals a space between the curved member 10 and the flat member 20 or the adhesive sheet 30, in an area where the first sealing portion 170 makes contact. However, the inventive concepts are not limited thereto.

Referring back to FIGS. 1 and 2, the jig device 300 is disposed between the first stage 100 and the second stage 200, which will be described below. The jig device 300 may be provided with the flat member 20, which is to be joined to the curved member 10. The jig device 300 may include a providing portion 350 corresponding to the accommodation portion 120 of the first stage 100. When the flat member 20 is prepared at the providing portion 350, and the first stage 100 is joined to the jig device 300, the curved member 10 of the accommodation portion 120 may come into contact with the flat member 20 of the providing portion 350. However, the inventive concepts are not limited thereto.

The jig device 300 according to an exemplary embodiment includes a first jig portion 310, a second jig portion 320, and a second body portion 330. The first jig portion 310 and the second jig portion 320 are fastened to the second body portion 330, and may pivot in one direction on the second body portion 330. The providing portion 350 of the jig device 300 may be substantially disposed on top surfaces of the first jig portion 310 and the second jig portion 320.

In an exemplary embodiment, each of the first jig portion 310 and the second jig portion 320 may include one end fastened to the second body portion 330, and the other end opposite to the one end having a rounded shape. The first jig portion 310 and the second jig portion 320 have substantially the same shape, and the one ends fastened to the second body portion 330 may be disposed to face each other. More particularly, the first jig portion 310 and the second jig portion 320 may have mutually symmetrical structures with respect to the second body portion 330. As such, hereinafter, the jig device 300 will be described with reference to the first jig portion 310 as an example.

The first jig portion 310 includes a first end 311 fastened to the second body portion 330, and a second end 312 opposite to the first end 311. A top surface between the first end 311 and the second end 312 may form a flat surface.

Since the flat member 20 is prepared on the first jig portion 310, a top surface of the first jig portion 310 is formed to be flat. On the other hand, a bottom surface between the first end 311 and the second end 312 has a partially flat area, and a bottom surface of the first end 311 may have a curvature. As will be described in more detail below, since the first jig 310 may pivot on a central axis located on the second body portion 330, a bottom surface of the first end 311 fastened to the second body portion 330 may have a curved shape along a turning radius. Accordingly, in the first jig portion 310, the second end 312 may have a shape protruding from the curved-shaped bottom surface. However, the inventive concepts are not limited thereto.

The first end 311 may be fastened to the second body portion 330, and may form a parallel side surface along one direction in a cross-sectional view. The side surface of the first end 311 may be in contact with the side surface of the first end of the second jig portion 320 while facing the same. The first end 311 may pivot on a central axis to be spaced apart from the first end of the second jig portion 320.

The second end 312 may have a rounded shape having a predetermined curvature. As will be described in more detail below, the second end 312 may place the flat member 20 to face the curved area of the curved member 10 prepared at the accommodation portion 120 in the joining process of the lamination apparatus 1000. The second end 312 of the first jig portion 310, which has the rounded shape, may allow the flat member 20 to face the curved portion of the curve surface member 10 to facilitate the joining process. Accordingly, it is possible to prevent a space from being formed in the curved portion when the curved member 10 is joined to the flat member 20. The rounded shape of the second end 312 is not particularly limited. As in the accommodation portion 120, the shape of the second end 312 may be designed according to the shape of the curved portion of the curved member 10.

The second body portion 330 forms a basic frame of the jig device 300. The second body portion 330 may provide a space, in which the first jig portion 310 and the second jig portion 320 are fastened, and the flat member 20 is prepared on the jig portions 310 and 320 in the joining process of the lamination apparatus 1000. Also, the central axis, where the first jig portion 310 and the second jig portion 320 are fastened to and pivot thereon, may be located in the second body portion 330. A detailed description thereof will be described with reference to other drawings.

The jig device 300 according to an exemplary embodiment may move in one direction, for example, in a vertical direction, which is a third direction (Z-axis direction) spaced apart from the first stage 100. In the joining process of the lamination apparatus 1000, the jig device 300 may move in the vertical direction, such that the flat member 20 prepared on the jig device 300 may face the curved member 10. The jig device 300 moves before the curved member 10 is joined to the flat member 20, such that the curved member 10 and the flat member 20 face each other, and the second stage 200, which will be described below, fixes the first stage 100 and the jig device 300. Afterwards, pressure is transferred to a space therebetween, such that the curved member 10 and the flat member 20 may be joined to each other. However, the inventive concepts are not limited thereto.

The jig device 300 may further include other members arranged on the second body portion 330. For example, a pressure forming device transferring high pressure between the second body portion 330 and the first stage 100 when they are joined, and a temperature controller adjusting a temperature of the flat member 20 prepared on the top surfaces of the jig portions 310 and 320 may be further disposed on the second body portion 330. However, the inventive concepts are not limited thereto.

According to an exemplary embodiment, in the jig device 300, the first jig portion 310 and the second jig portion 320 may pivot on the central axis located at the second body portion 330 in a certain radius.

Figure 5:
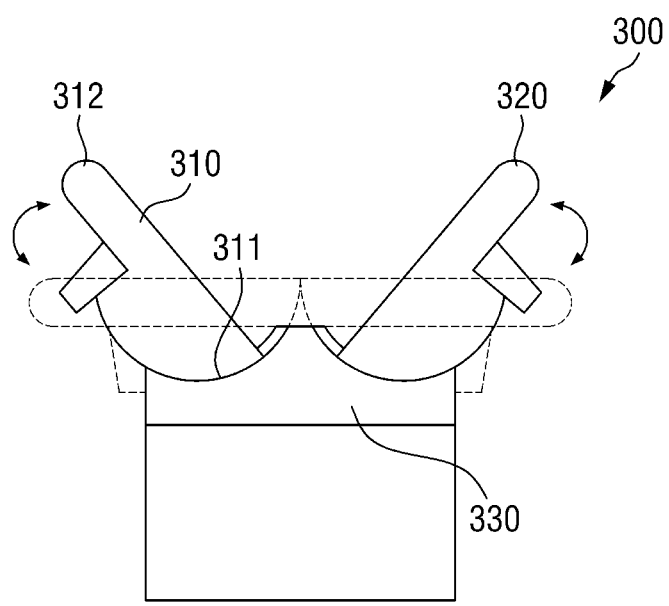
FIG. 5 is a schematic diagram illustrating an operation of a jig device according to an exemplary embodiment.

FIG. 5 is a schematic diagram illustrating an operation of the jig device according to an exemplary embodiment.

In the jig device 300 shown in FIG. 5, dotted lines indicate an initial state of the jig portions 310 and 320 when not pivoted, and solid lines indicate the jig portions 310 and 320 when pivoted along a certain radius.

Referring to FIG. 5, the first jig portion 310 and the second jig portion 320 are fastened to the second body portion 330, and the central axis extending in one direction may be located in the fastened area. The first jig portion 310 and the second jig portion 320 may pivot by a certain radius with respect to the central axis.

The flat member 20 prepared on the jig device 300 may be prepared, while a partial area thereof is bent before facing the curved member 10 to be easily joined to a curved outer surface of the curved member 10. The flat member 20 may access the curved member 10 while the partial area is bent, and then may face the curved member 10 as the bent area is unbent. Here, the flat member 20 may be prepared on the jig portions 310 and 320, and the flat member 20 may be bent as the jig portions 310 and 320 pivot by a certain radius. The jig device 300 according to an exemplary embodiment includes a plurality of jig portions 310 and 320, which are pivotable by a certain radius, such that the flat member 20 may be formed while a partial area thereof is bent in the joining process of the lamination apparatus 1000. Both ends of the flat member 20 prepared while being bent are located on the rounded second ends 312 of the jig portions 310 and 320, and may face the curved outer part of the curved member 10 as the jig portions 310 and 320 pivot again in opposite directions.

More particularly, when a space between the curved outer parts of the curved member 10 is smaller than a width of the curved member 10, it may not be easy to join the flat member 20 to the curved member 10. However, the lamination apparatus 1000 according to an exemplary embodiment may bend the flat member 20 to have a smaller width than the space between the curved outer parts of the curved member 10. Afterwards, the flat member 20 is unbent again, such that the curved member 10 and the flat member 20 may be mutually joined at a precise position. A more detailed description will be set forth below.

In an exemplary embodiment, the area of the second body portion 330, to which the first jig portion 310 and the second jig portion 320 are fastened, may move in one direction, for example, in the vertical direction which is the third direction (Z-axis direction) spaced apart from the first stage 100 A portion of the second body portion 330, in which the central axis is located, may be vertically moved, such that the first jig portion 310 and the second jig portion 320 may pivot by a certain radius.

As shown in the drawings, as the second body portion 330 moves in the vertical direction, the central axis of the first jig portion 310 and the second jig portion 320 may move, such that the first jig portion 310 and the second jig portion 320 may pivot by a certain radius on the central axis. However, the inventive concepts are not limited thereto. For example, in some exemplary embodiments, while the second body portion 330 may not move, the first jig portion 310 and the second jig portion 320 may pivot on the central axis.

Referring back to FIGS. 1 and 2, the second stage 200 faces the first stage 100, and is disposed below the jig device 300. The second stage 200 may be a lower stage of the lamination apparatus 1000. The second stage 200 may fix the jig device 300 simultaneously while sealing the gap between the curved member 10 provided on the first stage 100 and the flat member 20 provided on the jig device 300 when the curved member 10 and the flat member 20 are joined. In the joining process using the lamination apparatus 1000, the second stage 200 may come into contact with and fix the first stage 100 and the jig device 300 below the jig device 300.

According to an exemplary embodiment, the second stage 200 may include a plurality of sub-stages 210 and 220 spaced apart from each other. The sub-stages 210 and 220 may include a first sub-stage 210 and a second sub-stage 220. However, the inventive concepts are not limited to a particular number of the sub-stages, and in some exemplary embodiments, the second stage 200 may include a larger number of sub-stages 210 and 220 that are separable from one another. The number of the sub-stages 210 and 220 may vary according to the shape of the jig portions 310 and 320 of the jig device 300.

The first sub-stage 210 and the second sub-stage 220 may be spaced apart in the first direction (X-axis direction). As shown in FIG. 2, the first sub-stage 210 and the second sub-stage 220 may be arranged to correspond to the first jig portion 310 and the second jig portion 320, respectively. The first sub-stage 210 and the second sub-stage 220 may be disposed below the jig portions 310 and 320 of the jig device 300, respectively, and the second body portion 330 of the jig device 300 may be located in a space therebetween. The first sub-stage 210 and the second sub-stage 220 have substantially the same shape, and may have a mutually symmetrical structure with respect to the space therebetween. Hereinafter, a structure and an operation of the first sub-stage 210 corresponding to the first jig portion 310 will be exemplarily described with reference to other drawings.

Figure 6:
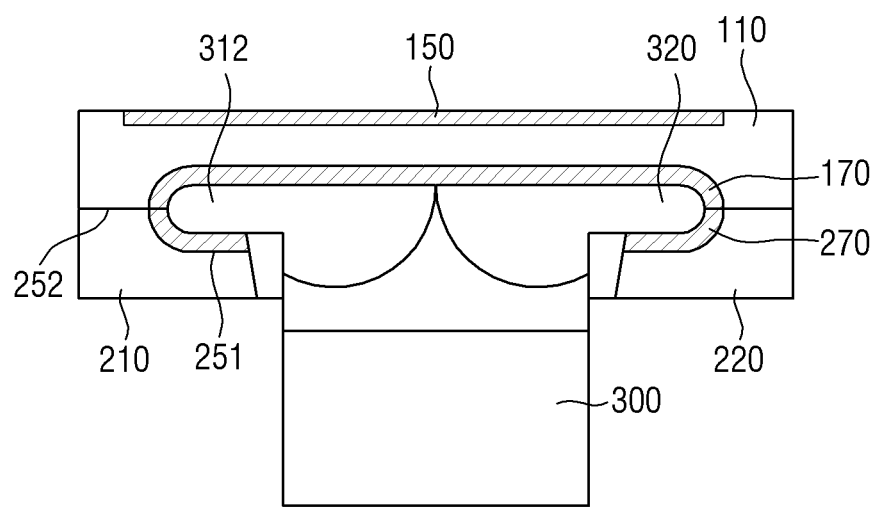
FIG. 6 is a schematic diagram illustrating an operation of a second stage according to an exemplary embodiment.
Figure 6:
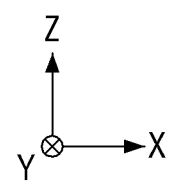

FIG. 6 is a schematic diagram illustrating an operation of the second stage according to an exemplary embodiment.

FIG. 6 illustrates a state in which the first stage 100, the jig device 300, and the second stage 200 are joined. Referring to FIGS. 2 and 6, a fixing area 251, 252 and a second sealing portion 270 may be disposed on the first sub-stage 210. The fixing area 251, 252 may be an area of the first sub-stage 210 coming into contact with and fixing the first stage 100 and the jig device 300 in the joining process of the lamination apparatus 1000. The fixing area 251, 252 may include a first fixing area 251, which comes into contact with the first stage 100, and a second fixing area 252 which comes into contact with the first jig portion 310.

In an exemplary embodiment, the first fixing area 251 may have a rounded shape having a predetermined curvature, and the second fixing area 252 may have a substantially flat top surface. The first sub-stage 210 is disposed to correspond to the first jig portion 310 as described above. When the second stage 200 is joined to the jig device 300 and the first stage 100, the second fixing area 252 of the first sub-stage 210 may come into contact with the first body portion 110 of the first stage 100 that protrudes toward the outside of the first jig portion 310, and the first fixing area 251 may be partially overlapped with the curved outer part of the first jig portion 310. More particularly, the second fixing area 252 having the flat top surface may come into contact with the bottom surface of the first body portion 110 of the first stage 100, and the first fixing area 251 may face the curved outer part of the first jig portion 310. Since the curved member 10 and the flat member 20 may be located between the first jig portion 310 and the first sub-stage 210, the first fixing area 251 may not come into direct contact with the first jig portion 310. In some exemplary embodiments, the first fixing area 251 may come into contact with the curved member 10, and may face a bottom surface of the first jig portion 310.

A shape of the first fixing area 251 may vary according to the shape of the first jig portion 310. Since the shape of the curved outer part of the first jig portion 310 varies according to the shape of the curved member 10 joined using the lamination apparatus 1000 as described above, the shape of the first fixing area 251 may also vary according to the shape of the curved member 10. However, the inventive concepts are not limited thereto.

Side surfaces of the first sub-stage 210 and the second sub-stage 220 spaced apart from each other may be formed to correspond to the second body portion 330 of the jig device 300. In the joining process of the lamination apparatus 1000, the side surfaces of the sub-stages 210 and 220 may come into contact with the second body portion 330 of the jig device 300 without a gap therebetween. Accordingly, in the high pressure process of joining the curved member 10 to the flat member 20, a high pressure may not leak through the space therebetween. However, the inventive concepts are not limited thereto.

The second sealing portion 270 may be disposed on each of the sub-stages 210 and 220 of the second stage 200. In an exemplary embodiment, the second sealing portion 270 may be disposed in a portion of each of the sub-stages 210 and 220 which comes into contact with members to be joined, such as s, the jig portions 310 and 320. In the joining process of the lamination apparatus 1000, the second sealing portion 270 may seal a space among the first stage 100, the jig device 300, and the second stage 200, which are joined to one another. In the drawings, it is shown that the second sealing portion 270 is disposed only on the first fixing area 251. However, the inventive concepts are not limited thereto. In some exemplary embodiments, the second sealing portion 270 may also be disposed on the second fixing area 252 and at least one side surface of the first sub-stage 210.

As shown in FIG. 6, when the first stage 100, the jig device 300, and the second stage 200 are joined, they may be spaced apart at a certain interval. For example, the interval may be within a range of 0.5 mm to 1.5 mm, without being limited thereto. High pressure is transferred to a space therebetween, which may adjoin the curved member 10 and the flat member 20 to each other. In the high pressure process, the second stage 200 may prevent the pressure from leaking to the outside from the lamination apparatus 1000, and may fix the jig device 300 to the first stage 100. As described above, when the curved member 10 and the flat member 20 having different shapes are joined, a contact area therebetween may be misaligned. The lamination apparatus 1000 according to an exemplary embodiment includes the first stage 100, which allows the curved-shape member 10 and the flat member 20 to come into contact with each other, and the second stage 200 that fixes the jig device 300. Also, since the second stage 200 includes the second sealing portion 270 which seals the space therebetween, it is possible to prevent or minimize a failure that may occur during the joining process of the lamination apparatus 1000.

Hereinafter, a joining process using the lamination apparatus 1000 according to an exemplary embodiment will be described in detail.

Figure 7:
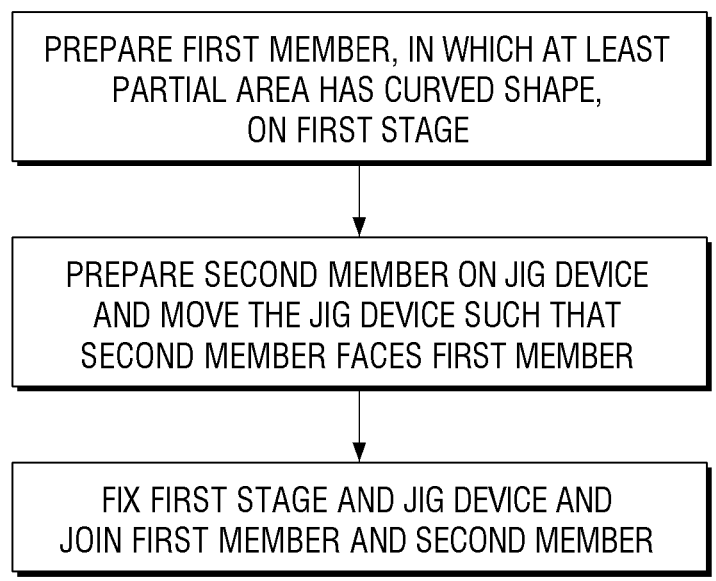
FIG. 7 is a flowchart illustrating a joining process using the lamination apparatus according to an exemplary embodiment.

FIG. 7 is a flowchart illustrating the joining process using the lamination apparatus according to an exemplary embodiment.

Referring to FIG. 7, the joining process using the lamination apparatus 1000 may include a first operation of preparing the first member, in particular, the curved member 10 on the first stage 100, a second operation of preparing the second member, in particular, the flat member 20 on the jig device 300, and moving the jig device 300 to allow the flat member 20 to face the curved member 10, and a third operation of fixing the first stage 100 and the jig device 300, and joining the curved-shape member 10 to the flat member 20.

According to an exemplary embodiment, in order to mutually join the curved member 10 and the flat member 20 having different shapes, the joining process using the lamination apparatus 1000 may include an operation of bending a partial area of the flat member 20 by pivoting the jig portions 310 and 320 of the jig device 300. Accordingly, the curved-shape member 10 having the curved partial area and the flat member 20 may be easily joined without a gap therebetween. The joining process using the lamination apparatus 1000 will be described in detail with reference to other drawings.

FIGS. 8 to 16 are cross-sectional views illustrating the joining process using the lamination apparatus according to an exemplary embodiment.

Figure 8:
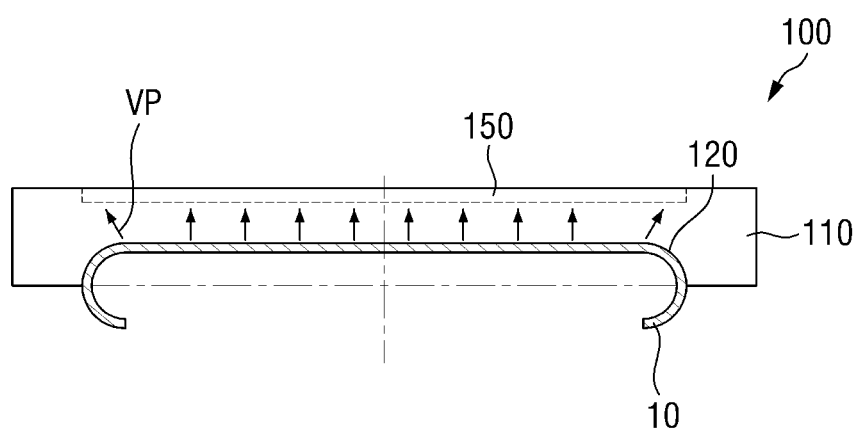
FIGS. 8, 9, 10, 11, 12, 13, 14, 15A, 15B, 15C, and 16 are cross-sectional views illustrating the joining process using the lamination apparatus according to an exemplary embodiment.

Referring to FIG. 8, the first member, for example, the curved member 10 is provided on the first stage 100. The curved member 10 may be provided to the accommodation portion 120 of the first stage 100. In an exemplary embodiment, when the curved member 10 is provided to the accommodation portion 120 of the first stage 100, the fixing device 150 may fix the curved member 10 by forming the vacuum pressure VP between the curved member 10 and the accommodation portion 120. The vacuum pressure VP formed by the fixing device 150 fixes the curved member 10 while a top surface of the curved member 10 is in contact with a bottom surface of the accommodation portion 120. Afterwards, the flat member 20 may be joined to the fixed curved member 10 at a precise position. Detailed descriptions of the fixing device 150 have been made above, and thus, will be omitted.

As described above, the first member, that is, the curved member 10 may have a partially curved area. As shown in the drawing, the curved member 10 may include one surface parallel to the bottom surface of the first stage 100, and a peripheral part bent downward from the one surface. The curved member 10 may include the flat one surface and the peripheral part having a curved shape. The lamination apparatus 1000 according to an exemplary embodiment may join the curved member 10 to the flat member 20 without a gap through pivoting of the jig portions 310 and 320 even when the peripheral part of the curved member 10 has a curved shape.

In an exemplary embodiment, a width of the flat surface of the curved member 10 may be less than a width of the curved member 10. In this case, the width may be measured in one direction, for example, from left to right. More particularly, the curved member 10 may have a shape in which the peripheral part protrudes from the flat surface. In the first jig portion 310 and the second jig portion 320 of the jig device 300, the second end 312 may have a rounded shape to correspond to the protruding peripheral part of the curved member 10. In a following operation, the flat member 20 prepared on the jig device 300 may be disposed on the rounded area of the second end 312 and joined to be corresponding to the peripheral part of the curved member 10.

According to an exemplary embodiment, the width between both bent ends of the peripheral part of the curved member 10 may be less than the width of the curved member 10. More particularly, the ends of the peripheral part of the curved member 10 may be formed to be recessed toward the inside of the curved member 10. An opening area formed by the ends of the peripheral part of the curved member 10 may be smaller than a width between outer sides thereof. As described below, the lamination apparatus 1000 according to an exemplary embodiment may partially bend the flat member 20 by pivoting the jig portions 310 and 320 and may join the flat member 20 to the open area having a width smaller than the width of the curved member 10. A more detailed description will be set forth below.

Figure 9:
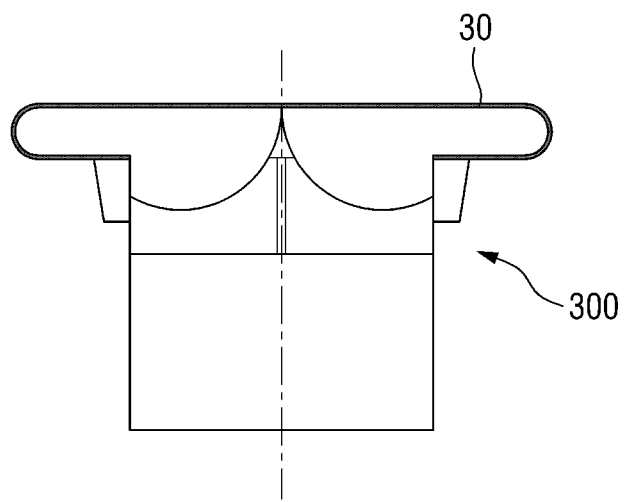

Next, the second member, for example, the flat member 20, is prepared on the jig device 300. In an exemplary embodiment, the flat member 20 may be disposed on the adhesive sheet 30 disposed above the jig device 300. Referring to FIG. 9, the adhesive sheet 30 is prepared on the jig device 300. The adhesive sheet 30 may be a double-sided adhesive sheet, in which a bottom surface thereof comes into contact with the jig device 300, and a top surface, to which the flat member 20 is disposed. Adhesion of the adhesive sheet 30 may be equal to or higher than 0.05 N/mm2.

The adhesive sheet 30 may be disposed to cover the top surfaces of the first jig portion 310 and the second jig portion 320, and outer surfaces of the rounded ends, that is, the second ends 312. As shown in the drawing, the adhesive sheet 30 may be partially disposed on bottom surfaces of the second ends 312 while covering the rounded outer surfaces of the second ends 312. In an exemplary embodiment, the adhesive sheet 30 may include an elastic material, and a partial area thereof may be bent or elongated according to pivoting of the jig portions 310 and 320. For example, the adhesive sheet 30 may have an elongation rate within a range of 50% to 300%.

When the jig portions 310 and 320 of the jig device 300 pivot on the central axis, an area of the adhesive sheet 30 may be partially elongated or contracted. Since the flat member 20 disposed on the adhesive sheet 30 may adhere to the top surface of the adhesive sheet 30, the shape of the flat member 20 may be varied according to deformation of the adhesive sheet 30. As such, to prevent the adhesive sheet 30 from being damaged by pivoting the jig portions 310 and 320, the adhesive sheet 30 may include an elastic material.

When the adhesive sheet 30 includes the elastic material, in the operation of joining the curved member 10 to the flat member 20, it is possible to uniformly join the curved member 10 to the flat member 20 in an area between the curved member 10 and the flat member 20, and particularly, in a curved area of the curved member 10, by applying high pressure to a space between the adhesive sheet 30 and the jig device 300. A description thereof will be set forth below.

Figure 10:
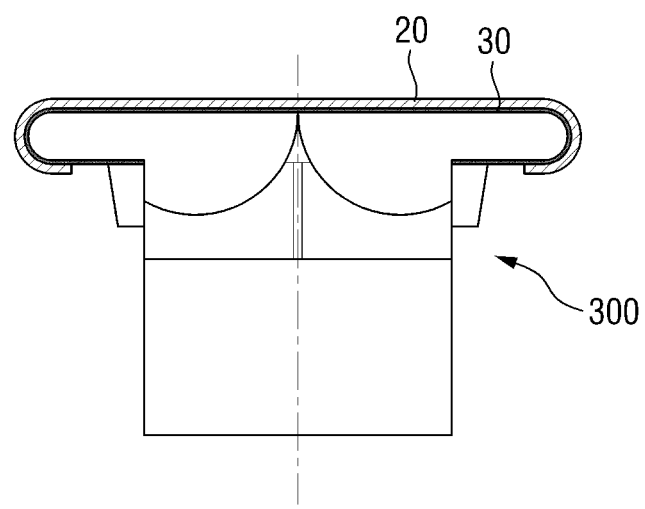

Referring to FIG. 10, the flat member 20 is prepared on the adhesive sheet 30. The flat member 20 may be attached to the adhesive sheet 30. In a following operation, when the adhesive sheet 30 is deformed according to pivoting of the jig portions 310 and 320, the shape of the flat member 20 may be deformed at the same time. Although the flat member 20 is described as being prepared on the jig device 300 after preparing the curved member 10 on the first stage, a sequence thereof is not particularly limited. For example, in some exemplary embodiments, the curved member 10 may be prepared after preparing the flat member 20.

Figure 11:
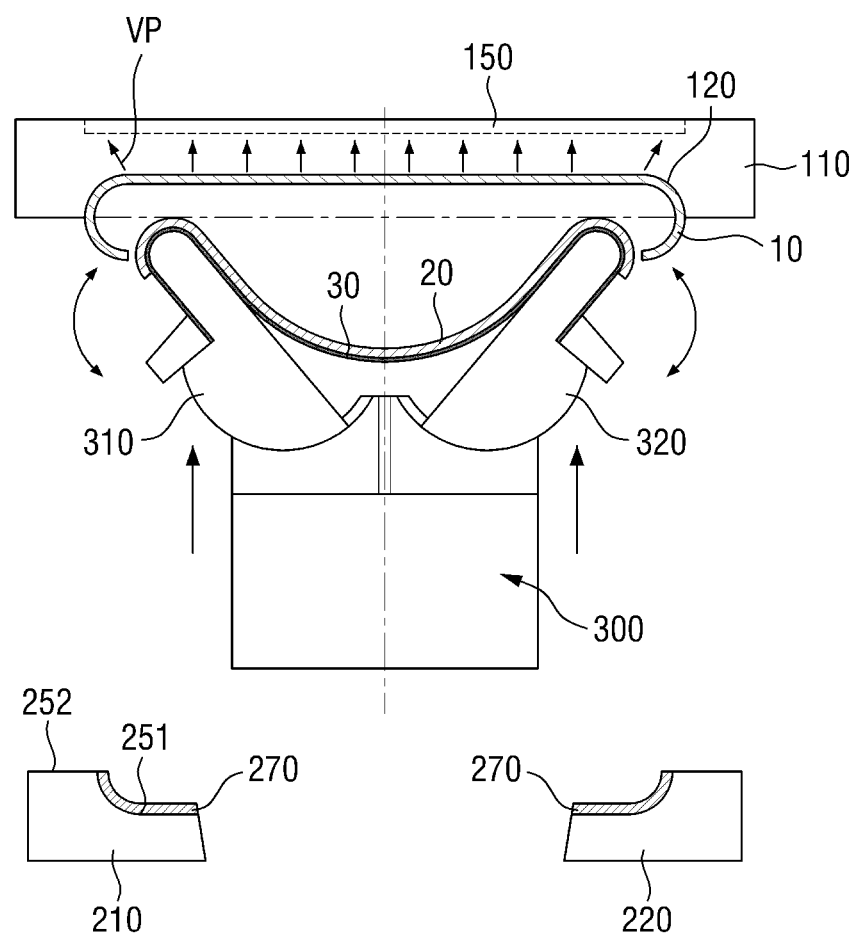

Referring to FIG. 11, the jig device 300 moves such that the flat member 20 faces the curved member 10. According to an exemplary embodiment, the operation of moving the jig device 300 may include an operation of bending the flat member 20 by pivoting the jig portions 310 and 320, such that a central part thereof is located below both ends thereof, and an operation of unbending the flat member 20 so as to be located adjacent to the curved member 10 while being spaced apart therefrom.

As described above, since the peripheral part of the curved member 10 has a downwardly curved shape, the open area of the curved member 10 may be smaller than the width of the curved member 10. When the flat member 20 is located to face the curved member 10, the flat member 20 may need to be moved to the open area smaller than the width of the curved member 10. As such, the lamination apparatus 1000 according to an exemplary embodiment may include the jig portions 310 and 320, which are pivotable by a certain radius, and the joining process may include the operation of the bending the flat member 20.

More particularly, the flat member 20 may be bent by pivoting the jig portions 310 and 320 in one direction, for example, in the upward direction which is the third direction (Z-axis direction) on the central axis. The flat member 20 disposed on the adhesive sheet 30 may be bent according to pivoting of the jig portions 310 and 320, such that the central part thereof is located below the both ends. For example, the flat member 20 may have a convex shape toward the jig portions 310 and 320 when bent. Accordingly, a distance between the both ends of the flat member 20 may become less than the width of the open area of the curved member 10.

Then, the flat member 20 is unbent and located to be adjacent to the curved member 10 while being spaced apart therefrom. In particular, the flat member 20 is inserted into the open area of the curved member 10 by moving the jig device 300 in an upward direction. When the flat member 20 is inserted into the open area, the flat member 20 is unbent by pivoting the jig portions 310 and 320 in an opposite direction, for example, in a downward direction. The above-described operations of the jig device 300 may be substantially continuously performed, such that the flat member 20 may be located to be adjacent to the curved member 10 while being spaced apart therefrom.

The operation of locating the flat member 20 to be spaced apart from the curved member 10 may be performed according to a preset reference alignment degree. In the operation of joining different members, when an alignment state thereof is imprecise, joining positions may become different to cause defects. Accordingly, the alignment degree may need to be precisely adjusted according to each of positions of the flat member 20 and the curved member 10.

Figure 12:
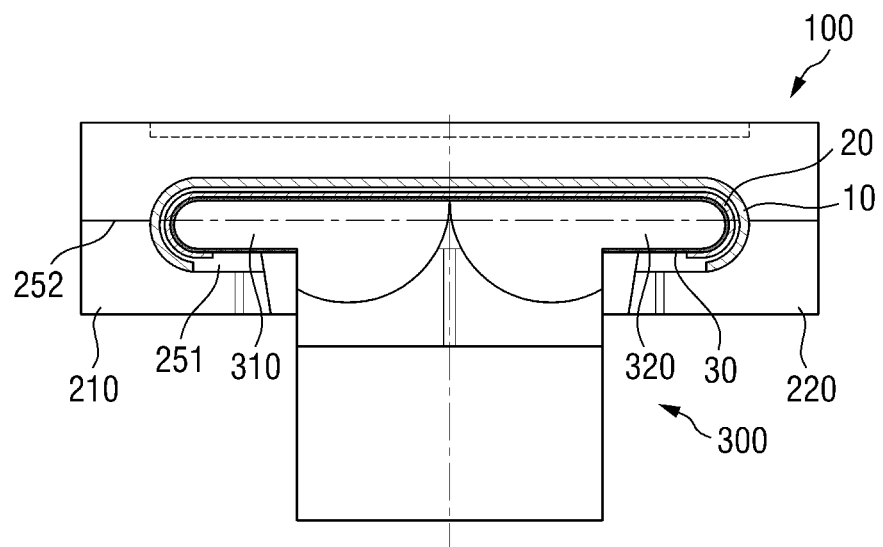

Referring to FIG. 12, the first stage 100 and the jig device 300 are fixed to each other. The fixing operation may be performed using the second stage 200. The first sub-stage 210 and the second sub-stage 220 of the second stage 200 may move in the third direction (Z-axis direction) and may be located below the first jig portion 310 and the second jig portion 320. As described above, the first fixing area 251 of the first sub-stage 210 may face the bottom surface of the first jig portion 310, and the second fixing area 252 may come into contact with the first body portion 110 of the first stage 100.

As shown in the drawing, since the jig device 300 disposes the curved member 10 and the flat member 20 to be spaced apart from each other, a space may be formed therebetween. In an exemplary embodiment, a width of the space may be within a range of 0.5 mm to 1.5 mm. However, the inventive concepts are not limited thereto. The curved member 10 and the flat member 20 may face each other while being spaced apart before being joined to each other.

The first fixing area 251 may face the bottom surface of the first jig portion 310, and the curved member 10 and the flat member 20 may be located in the space therebetween. In some exemplary embodiments, the first fixing area 251 of the curved area may come into contact with the curved member 10. As described above, the fixing areas 250 of the sub-stages 210 and 220 may be designed according to the curved shape of the curved member 10.

Also, since the first stage 100 and the second stage 200 include the sealing portions 170 and 270, respectively, the sealing portions 170 and 270 may be disposed in a contact area of the first stage 100 and the second stage 200. The sealing portions 170 and 270 may seal an area between the first stage 100 and the second stage 200, and an area between the second stage 200 and the jig device 300. According to an exemplary embodiment, the sealing portions 170 and 270 may come into partial contact with the adhesive sheet 30, and a partial area of the adhesive sheet 30, which comes into contact with the sealing portions 170 and 270, may form a partition between the curved member 10 and the flat member 20. Accordingly, in a following operation, it is possible to prevent pressure applied therebetween from leaking.

Figure 13:
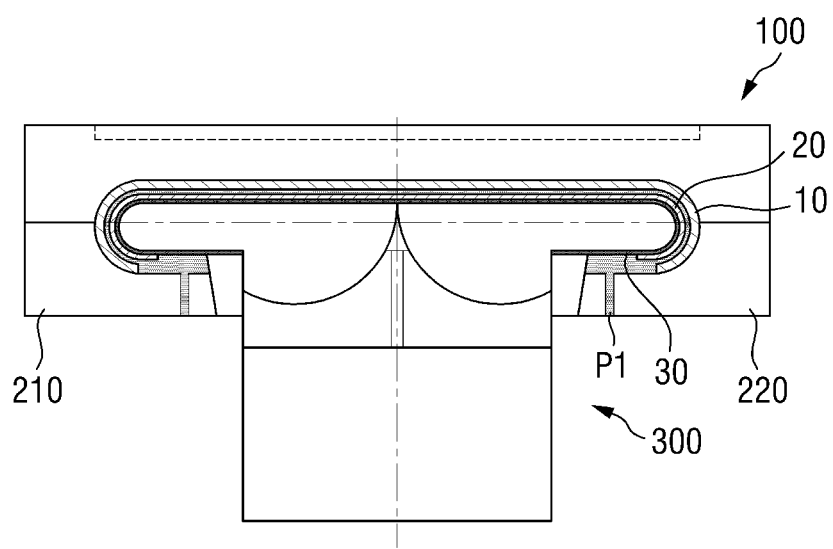
Figure 14:
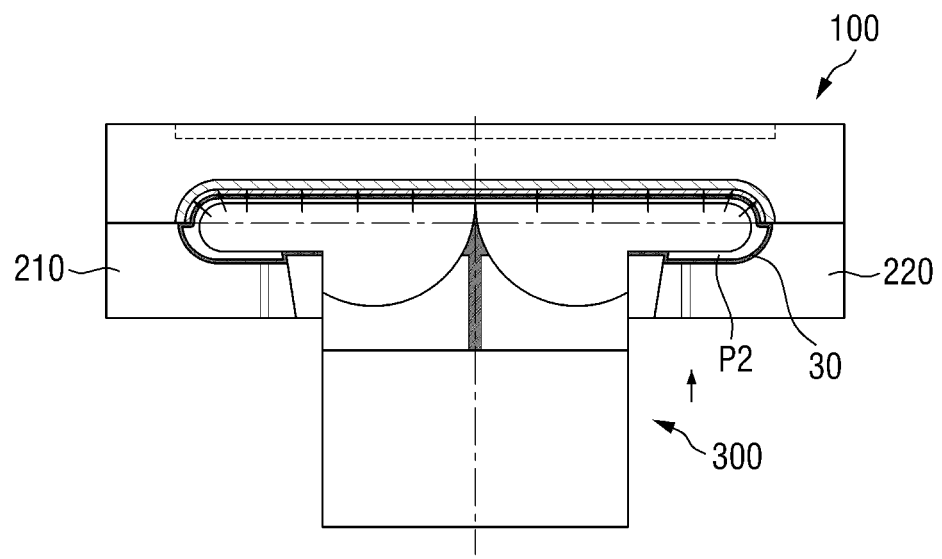

Referring to FIGS. 13 and 14, the curved member 10 and the flat member 20 are joined. According to an exemplary embodiment, the operation of joining the curved member 10 to the flat member 20 may include an operation of applying a first pressure P1 between the first stage 100 and the jig device 300, and an operation of joining the curved member 10 to the flat member 20 by applying a second pressure P2 higher than the first pressure P1 between the jig device 300 and the adhesive sheet 30.

More particularly, as shown in FIG. 13, the first pressure P1 is applied to the space between the curved member 10 and the flat member 20. In an exemplary embodiment, the first pressure P1 may be within a range of 10 Pa to 10 kPa. However, the inventive concepts are not limited thereto. The first pressure P1 may be lower than the second pressure P2. As the first pressure P1, which is relatively low, is applied to an area between the curved member 10 and the flat member 20, an environment similar to a vacuum may be formed in a space therebetween. Accordingly, when the curve-shaped member 10 is joined to the flat member 20 by the applied second pressure P2 in a following operation, it is possible to prevent bubbles or foreign substances from being generated therebetween.

Next, as shown in FIG. 14, the curved member 10 is joined to the flat member 20 by applying the second pressure P2, which is relatively high, between the jig device 300 and the adhesive sheet 30. In an exemplary embodiment, the second pressure P2 may be within a range of 0.1 MPa to 0.9 MPa, without being limited thereto.

The second pressure P2 is applied below the adhesive sheet 30 disposed on the jig device 300. When the relatively low first pressure P1 is applied between the curved member 10 and the flat member 20, and the relatively high second pressure P2 is applied between the jig device 300 and the adhesive sheet 30, the adhesive sheet 30 may be pushed out in an upward direction, such that the flat member 20 may be joined to the curved member 10. In this case, since the adhesive sheet 30 includes an elastic material, the flat member 20 may be uniformly joined to the curved member 10 by the second pressure P2 in an area that comes into contact with the adhesive sheet 30.

More particularly, the curved peripheral part of the curved member 10 may face the flat member 20 on the rounded second ends 312 of the jig portions 310 and 320. The flat member 20 pushed out by the adhesive sheet 30 on the second ends 312 may be joined to the curved member 10 with a uniform quality throughout.

The first pressure P1 and the second pressure P2 may be applied through an additional pressure forming device connected to the jig device 300.

The lamination apparatus 1000 according to an exemplary embodiment may further include an additional device for preventing bubbles or foreign substances from occurring in the process of joining the curved member 10 to the flat member 20. More particularly, when the curved member 10 and the flat member 20 are joined first in both ends thereof by both ends of the jig portions 310 and 320, bubbles may occur or foreign substances may be remained in a central part between the both ends. The jig device 300 of the lamination apparatus 1000 according to an exemplary embodiment may further include an additional device, which joins central parts of the curved member 10 and the flat member 20 first, and then sequentially joins both ends thereof.

Figure 15A:
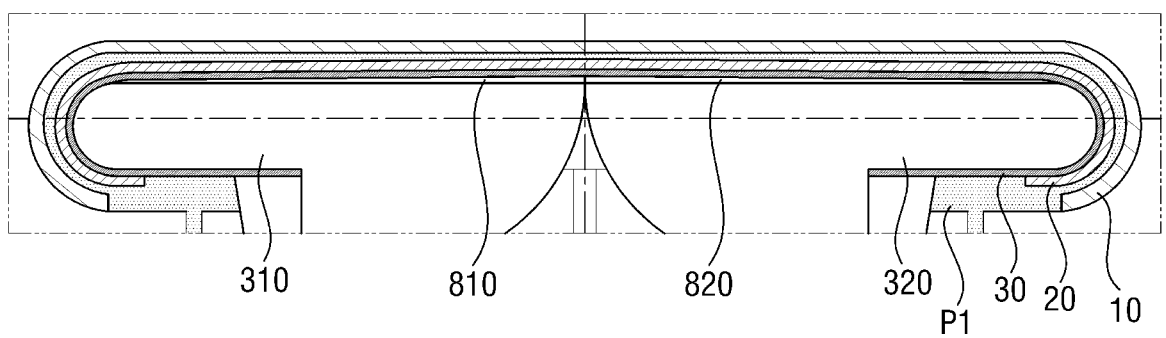
Figure 15B:
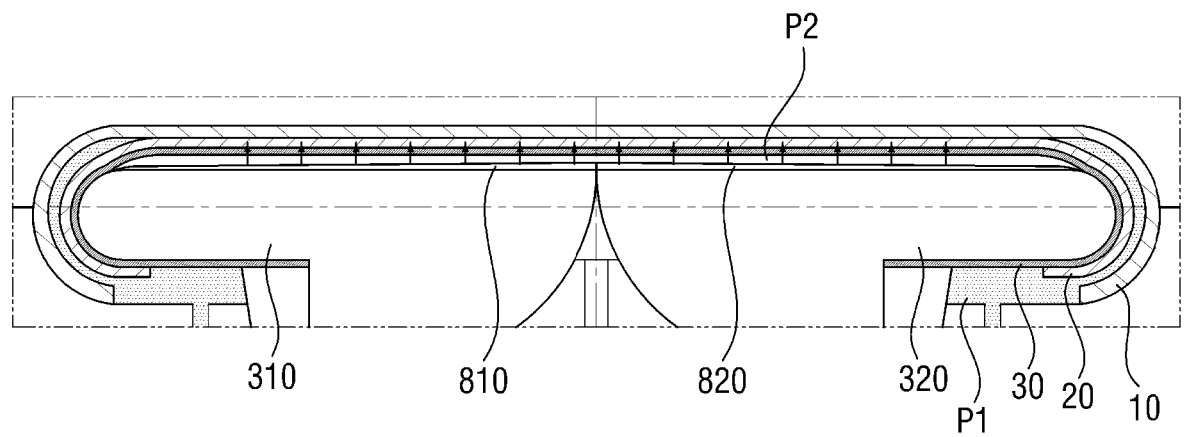
Figure 15C:
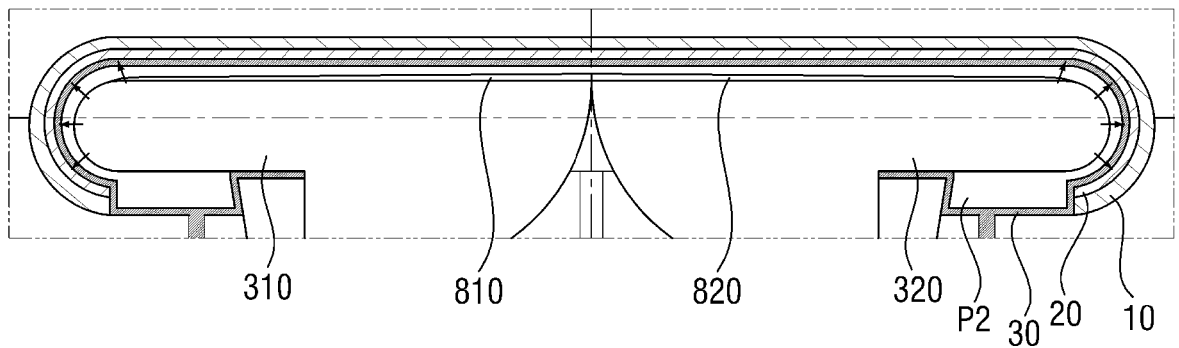

FIGS. 15A to 15C are schematic diagrams illustrating a joining process using the jig device 300 which further includes protruding members 810 and 820 according to an exemplary embodiment.

The jig device 300 according to the illustrated exemplary embodiment may further include the protruding members 810 and 820 disposed in at least partial areas of the first jig portion 310 and the second jig portion 320. The protruding members 810 and 820 may include a first protruding member 810 disposed on the first jig portion 310, and a second protruding member 820 disposed on the second jig portion 320. The first protruding member 810 and the second protruding member 820 may have a shape that is gradually inclined from an area adjacent to the central axis located in the second body portion 330, to which the first jig portion 310 and the second jig portion 320 are fastened, toward outer ends. For example, the first protruding member 810 may have a shape, in which a portion adjacent to the first end 311 of the first jig portion 310 protrudes upward as compared to a portion adjacent to the second end 312. Due to the protruding members 810 and 820, the first jig portion 310 and the second jig portion 320 may have shapes, in which central areas adjacent to the second body portion 330 protrude upward than outer parts. In an exemplary embodiment, the first protruding member 810 and the second protruding member 820 may include materials, such as silicone, polyimide, and the like, without being limited thereto.

Referring to FIG. 15A, when the adhesive sheet 30 is disposed on the first jig portion 310 and the second jig portion 320, and the flat member 20 is disposed on the adhesive sheet 30, central parts thereof may protrude upward and may be gradually inclined toward outer parts according to the first protruding member 810 and the second protruding member 810. The central part protruding upward due to an inclination of the flat member 20 may be located to be more adjacent to the curved member 10 than the outer part.

Next, referring to FIGS. 15B and 15C, in the process of applying the second pressure P2, which is relatively high, between the jig device 300 and the adhesive sheet 30, the central parts of the adhesive sheet 30 and the flat member 20 may be joined first to the curved member 10 rather than the outer parts thereof. Afterwards, as the adhesive sheet 30 is pushed out by the second pressure P2, the central parts and the outer parts of the curved member 10 and the flat member 20 may be sequentially joined. Accordingly, in the joining process using the lamination apparatus 1000, it is possible to prevent the occurrence of bubbles or foreign substances between the curved member 10 and the flat member 20.

Figure 16:
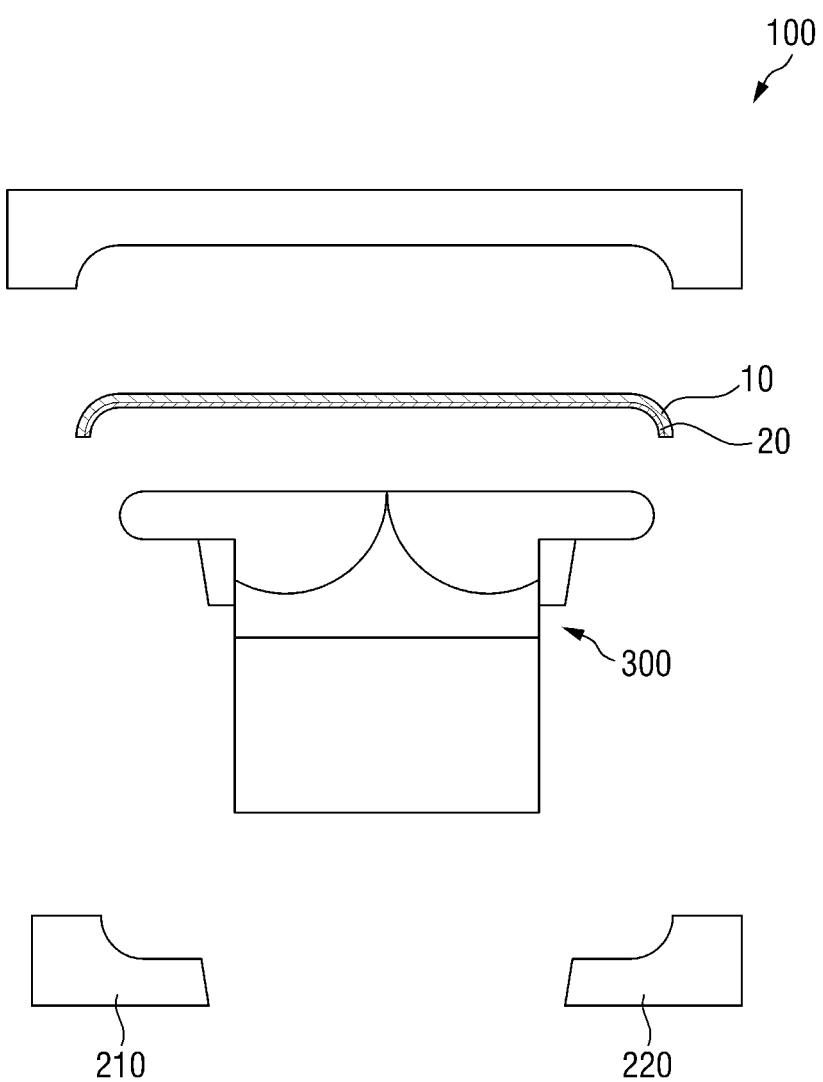

However, the inventive concepts are not limited thereto. In the lamination apparatus 1000 according to an exemplary embodiment, the jig device 300 does not include the protruding members 810 and 820, and may include devices which join the curved member 10 and the flat member 20 to each other from the central parts thereof first. For example, the jig device 300 may include a device, which may sequentially apply air pressure from the central part toward the outer part of the adhesive sheet 30 in the operation of applying the second pressure P2, or may include an additional roller device to sequentially join the curve-shaped member 10 and the flat member 20 to each other from the central parts toward the outer parts. In this manner, as shown in FIG. 16, a resultant product, in which the curved member 10 and the flat member 20 are joined, may be manufactured by separating the first stage 100, the second stage 200, and the jig device 300 from one another.

Through the above processes, the curved member 10 and the flat member 20 may be mutually joined using the lamination apparatus 1000 according to an exemplary embodiment. The lamination apparatus 1000 includes the jig device 300 including the pivotable jig portions 310 and 320, so as to prevent damage caused by rubbing between the curved member 10 and the flat member 20. Also, the jig portions 310 and 320 may dispose the flat member 20 by pivoting by a certain radius, such that a gap that may otherwise occur in the curved area of the curved member 10 or a defect in alignment with the flat member 20 may be minimized.

More particularly, even when the curved peripheral part of the curved member 10 has a variety of curvatures, the rounded second ends 312 of the first jig portion 310 and the second jig portion 320 may be designed according to the peripheral part. Accordingly, the lamination apparatus 1000 according to an exemplary embodiment may join the flat member 20 with a uniform quality regardless of a shape of the curved member 10.

In another exemplary embodiment, when the peripheral part of the curved member 10 is not curved as compared to the curved member 10 of FIG. 8, and the open area of the curved member 10 is large, the operation of pivoting the first jig portion 310 and the second jig portion 320 may be omitted. That is, when it is possible to locate the flat member 20 to face the curved member 10 while being spaced apart without bending, the operation of pivoting the jig portions 310 and 320 and inserting the flat member 20 into the open area of the curved member 10 may be omitted.

FIGS. 17 to 20 are cross-sectional views illustrating a joining process using the lamination apparatus according to another exemplary embodiment.

Figure 17:
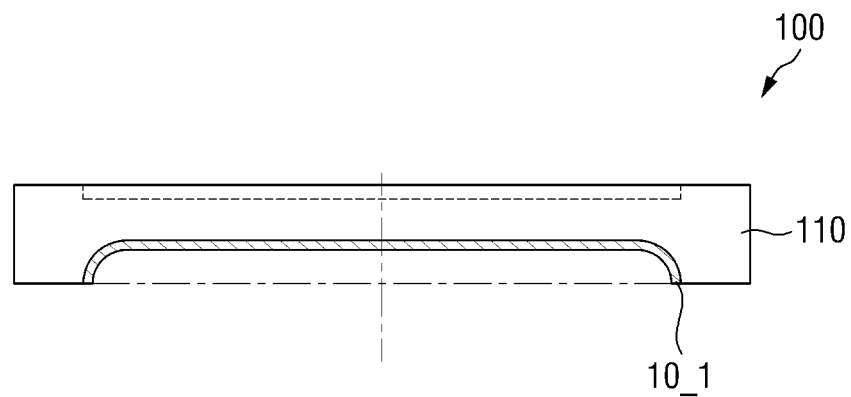
FIGS. 17, 18, 19, and 20 are cross-sectional views illustrating a joining process using the lamination apparatus according to another exemplary embodiment.

Referring to FIG. 17, a curved-shape member 10_1 is provided to the accommodation portion 120 of the first stage 100. Unlike the curved member 10 of FIG. 8, in the curved member 10_1, a width measured in one direction may be equal to a distance between ends of a peripheral part, that is, a width of an open area. Accordingly, the jig device 300 moves while the jig portions 310 and 320 are not pivoted, such that a flat member 20_1 disposed on the jig device 300 may be spaced apart from and face the curved member 10_1.

Figure 18:
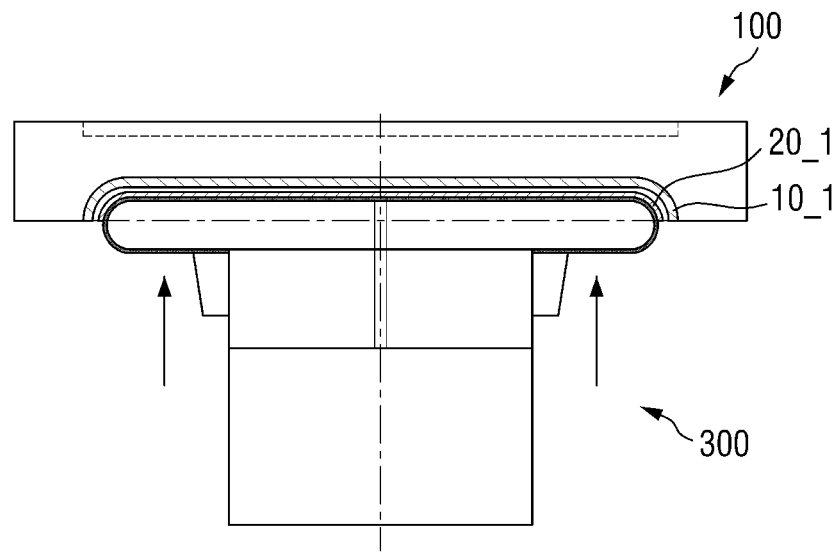

Referring to FIG. 18, the jig device 300 is moved, such that the flat member 20_1 is spaced apart from and faces the curved-shape member 10_1. Unlike the process shown in FIG. 11, the jig portions 310 and 320 according to the illustrated exemplary embodiment do not pivot, and thus, the flat member 20_1 is not bent. Since the open area of the curved member 10_1 is larger than a width of the flat member 20_1 which is not bent, the jig device 300 moves while the flat member 20_1 is not bent. The flat member 20_1 may be spaced apart from and face the curved member 10_1 as the jig device 300 moves in an upward direction.

Figure 19:
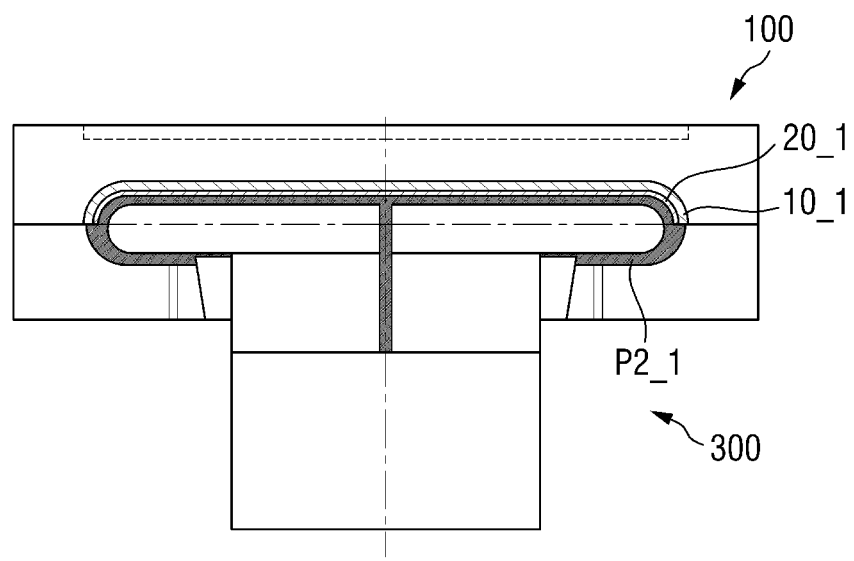
Figure 20:
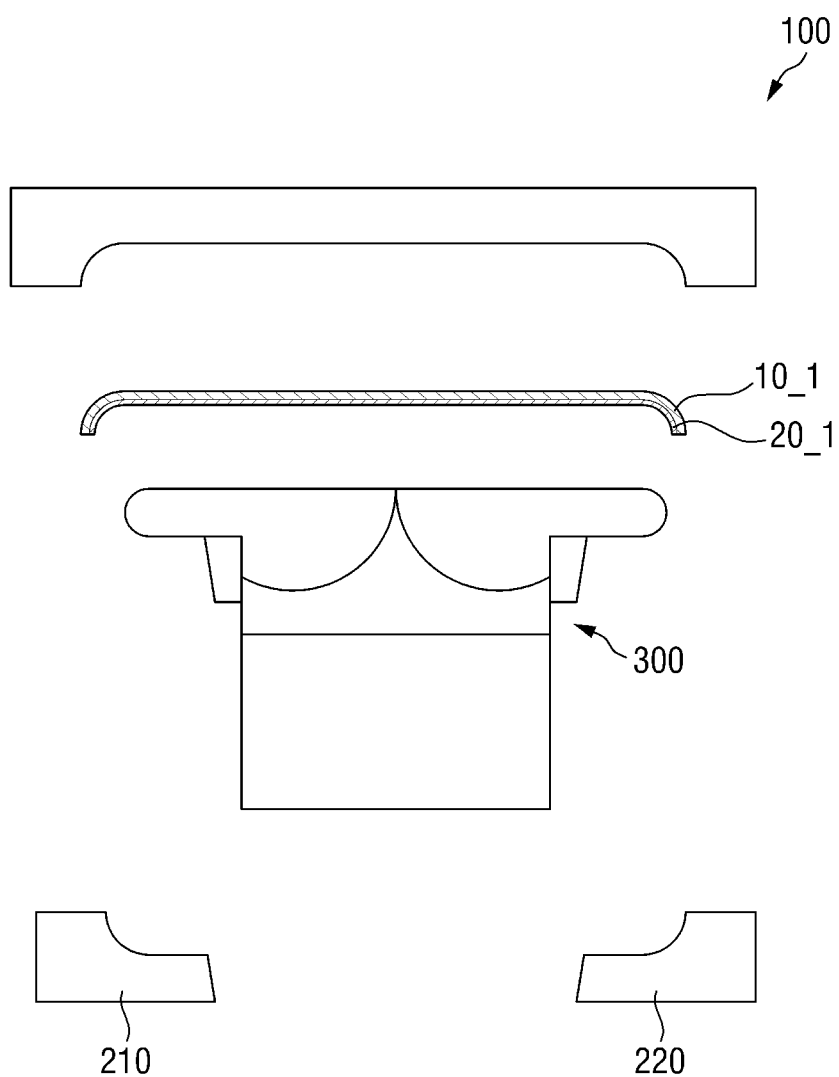

Referring to FIGS. 19 and 20, the first stage 100 and the jig device 300 are fixed using the second stage 200, the first pressure P1 is applied between the first stage 100 and the jig device 300, and a second pressure P2_1 is applied between the jig device 300 and the adhesive sheet 30. The second pressure P2_1 applied to the adhesive sheet 30 pushes the flat member 20_1 toward the curved member 10_1 to mutually join the flat member 20_1 and the curved member 10_1. A description on the above process is substantially the same as the above description with reference to FIGS. 8 to 16. More particularly, as described above with reference to FIGS. 15A to 15C, a process of sequentially joining the flat member 20_1 and the curved member 10_1 from central parts thereof to outer parts may be performed.

In an exemplary embodiment, the curved member 10 and the flat member 20, which are mutually joined through the joining process using the lamination apparatus 1000, may form a display device. For example, the curved member 10 may be a cover window 10' (see FIG. 21), in which at least a partial area thereof is curved, and the flat member 20 may be a display panel 20' (see FIG. 21).

Figure 21:
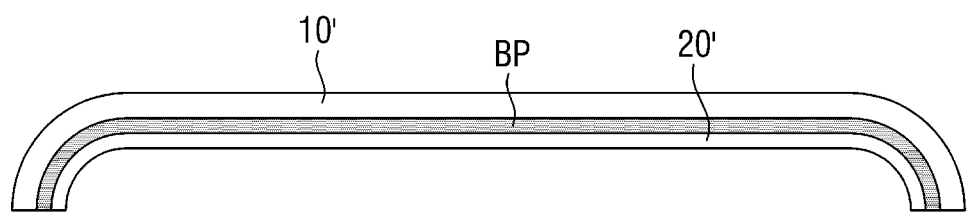
FIG. 21 is a schematic cross-sectional view of a display device according to an exemplary embodiment.

FIG. 21 is a schematic cross-sectional view of a display device according to an exemplary embodiment.

Referring to FIG. 21, the display device according to the illustrated exemplary embodiment may include the cover window 10', a binding member BP, and the display panel 20'. The lamination apparatus 1000 according to an exemplary embodiment may manufacture the display device by mutually joining the cover window 10' and the display panel 20'. More particularly, the display device of FIG. 21 may be a resultant product manufactured through the joining process of the lamination apparatus 1000.

The display device displays a screen or an image through a display portion, and may include a variety of devices other than the display portion. For example, the display device 1 may include a smart phone, a cell phone, a tablet personal computer (PC), a personal digital assistant (PDA), a portable multimedia player (PMP), a television, a game console, a watch type electronic device, a head-mounted display, a monitor of a PC, a laptop computer, a navigation of a vehicle, a dashboard of a vehicle, a digital camera, a camcorder, an outdoor billboard, an electronic display, a variety of medical devices, a variety of detecting devices, a variety of home appliances including a display area (DA), such as a refrigerator, a washing machine, and the like, an Internet of Things (IoT) device, and the like, without being limited thereto. For example, the display device may include a foldable display device, which will be described below, such as a foldable smart phone, a tablet PC, a laptop PC, without being limited thereto.

The cover window 10' of the display device 1 performs a function of protecting the display panel 20'. The cover window 10' may be formed of a transparent material. The cover window 10' may include, for example, glass or plastic.

When the cover window 10' includes glass, the glass may be ultra thin glass (UTG) or thin glass. When the glass is formed as UTG or thin glass, the glass may have a flexible property so as to be warped, bent, folded, or rolled. For example, the cover window 10' may be bent, such that a partial area thereof may have a curved shape, as shown in the drawing.

The display panel 20' of the display device is a panel, which displays a screen or an image, and may include, for example, not only self radiation display panels, such as an organic light emitting display (OLED) panel, an inorganic electroluminescence (EL) display panel, a quantum electrodynamics (QED) panel, a micro light emitting display (LED) panel, a nano-LED panel, a plasma display panel (PDP), a field emission display (FED) panel, a cathode-ray tube (CRT), and the like, but also light-receiving display panels, such as a liquid display panel (LCD), an electrophoretic display (EPD), and the like. Hereinafter, an OLED panel will be described as an example of the display panel 20', and unless particularly noted elsewhere, the OLED panel applied to the exemplary embodiments will be referred as the display panel 20'. However, the inventive concepts are not limited to the OLED panel, and other examples of the display panel 20', which are mentioned above or which are well known in the art, may be applied.

The binding member BP is disposed between the cover window 10' and the display panel 20'. The binding member BP may mutually bind the cover window 10' and the display panel 20'.

In some exemplary embodiments, the display device may further include an optical member between the cover window 10' and the display panel 20'. In this case, the optical member may be prepared with the display panel 20' on the providing portion 350 of the jig device 300, and may be joined to the cover window 10' provided on the first stage 100, as in the manner described above.

According to an exemplary embodiment, a lamination apparatus includes a first stage, a second stage, and a jig device, and the jig device includes at least one jig portion which is pivotable on a central axis located in a body portion. When the first member and the second member having different shapes are to be joined, the first member is prepared on a first stage and the second member is prepared on the jig device, such that a partial area of the second member may be bent by pivoting the jig portions of the jig device before joining the first member to the second member. Accordingly, the lamination apparatus may easily join the first member to the second member even when they have different shapes.

Also, according to an exemplary embodiment, a display device can be manufactured by joining a cover window having a curved surface shape to the display panel having a flat surface shape at precise positions using the lamination apparatus without a gap therebetween, while preventing or at least suppressing damage to a display panel or defects from the joining process.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing a display device, comprising:

preparing a first member on a first stage of a lamination device, the first member having at least one curved portion;

preparing a second member on a jig device spaced apart from the first stage by forming an adhesive sheet on the jig device and placing the second member on the adhesive sheet to have the second member substantially conform to a shape of the first member, wherein the jig device comprises a body portion and at least one jig portion having a first end fastened to the body portion and a second end having a rounded shape, and the jig portion pivots by a predetermined radius on a central axis disposed in the body portion;

moving the jig device to temporarily alter the shape of the second member, such that a shape of the second member does not conform to the shape of the first member, comprising:
bending the second member by pivoting the jig portion, such that a central part of the second member is placed below both ends thereof; and
unbending the second member to be disposed adjacent to the first member while being spaced apart from the first member; and fixing the first stage and the jig device and joining the first member and the second member.

2. A method of manufacturing a display device, comprising:

preparing a first member on a first stage of a lamination apparatus, the first member having at least one curved portion;

forming an adhesive sheet on a jig device spaced apart from the first stage, and placing a second member on the adhesive sheet and moving the jig device, such that the second member faces the first member; and fixing the first stage and the jig device and joining the first member and the second member, comprising:
applying a first pressure between the first stage and the jig device; and
applying a second pressure higher than the first pressure between the jig device and the adhesive sheet.

3. The method of claim 2, wherein the first pressure is within a range of 10 Pa to 10 kPa, and the second pressure is within a range of 0.1 MPa to 0.9 MPa.

4. The method of claim 1, wherein:
the first stage further comprises a vacuum pressurizer forming a vacuum at least in a partial area of a bottom surface of the first stage; and
the first member is provided on the bottom surface of the first stage and the vacuum pressurizer forms a vacuum between the first member and the bottom surface.

5. The method of claim 4, wherein:
the first member comprises one surface parallel to the bottom surface of the first stage and a first peripheral part bent downward from the one surface; and
a width of the one surface of the first member along a second direction is less than a width of the first member measured in the second direction.

6. The method of claim 5, wherein:
the first member further comprises a second peripheral part bent downward from the one surface; and
a width between opposing ends of the first and second peripheral parts of the first member is less than the width of the first member measured in the second direction.

* * * * *